(12) United States Patent
Chung

(10) Patent No.: US 11,557,363 B2
(45) Date of Patent: Jan. 17, 2023

(54) INTEGRATED CIRCUIT AND TEST OPERATION METHOD THEREOF

(71) Applicant: SK hynix Inc., Icheon-si (KR)

(72) Inventor: Seung Hyun Chung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/150,921

(22) Filed: Jan. 15, 2021

(65) Prior Publication Data
US 2022/0068420 A1 Mar. 3, 2022

(30) Foreign Application Priority Data
Aug. 25, 2020 (KR) .................. 10-2020-0107398

(51) Int. Cl.
*G11C 29/20* (2006.01)
(52) U.S. Cl.
CPC .................... *G11C 29/20* (2013.01)
(58) Field of Classification Search
CPC ...................................... G11C 29/20
See application file for complete search history.

(56) References Cited

U.S. PATENT DOCUMENTS

| | | | | |
|---|---|---|---|---|
| 4,051,460 A | * | 9/1977 | Yamada | G11C 29/20 711/115 |
| 2015/0043292 A1 | * | 2/2015 | Lee | G11C 29/025 365/201 |
| 2016/0293243 A1 | * | 10/2016 | Joo | G11C 29/783 |

FOREIGN PATENT DOCUMENTS

| KR | 1020030002157 A | 1/2003 |
|---|---|---|
| KR | 1020190029316 A | 3/2019 |
| KR | 1020220026420 A | 3/2022 |

* cited by examiner

*Primary Examiner* — Mohammed A Bashar
(74) *Attorney, Agent, or Firm* — William Park & Associates Ltd.

(57) ABSTRACT

An integrated circuit includes a test counting circuit, a test information storage circuit, a sequence control circuit and a driving circuit. The test counting circuit generates a counting address signal. The test information storage circuit stores a test control value and outputs the test control value based on the counting address signal. The sequence control circuit changes an output sequence of the test control value based on a sequence control signal and outputs a final test control value based on the test control value or a target control value. The driving circuit performs a pre-set test operation based on the final test control value.

18 Claims, 5 Drawing Sheets

| INF_1 | 003 |
|---|---|
| INF_2 | 007 |

| ADD_C | 001 | 002 | 003 | 007 | 008 | 009 |
|---|---|---|---|---|---|---|
| V_CTR | DAT_1 | DAT_2 | DAT_3 | DAT_7 | DAT_8 | DAT_9 |

| INF_1 | 003 |
|---|---|
| INF_2 | DAT_TM |

| ADD_C | 001 | 002 | 003 | 004 | 005 |
|---|---|---|---|---|---|
| V_OR | DAT_1 | DAT_2 | DAT_3 | DAT_4 | DAT_5 |
| V_CTR | DAT_1 | DAT_2 | DAT_TM | DAT_4 | DAT_5 |

| INF_1 | 003 |
|---|---|
| INF_2 | DAT_TM |

| ADD_C | 001 | 002 | 003 | 003 | 004 | 005 |
|---|---|---|---|---|---|---|
| V_OR | DAT_1 | DAT_2 | DAT_3 | DAT_3 | DAT_4 | DAT_5 |
| V_CTR | DAT_1 | DAT_2 | DAT_3 | DAT_TM | DAT_4 | DAT_5 |

| INF_1 | 003 |
|---|---|
| INF_2 | 007 |

| ADD_C | 001 | 002 | 003 | 007 | 008 | 009 |
|---|---|---|---|---|---|---|
| V_CTR | DAT_1 | DAT_2 | DAT_3 | DAT_7 | DAT_8 | DAT_9 |

| INF_1 | 003 |
|---|---|
| INF_2 | 007 |

| ADD_C | 001 | 002 | 003 | 007 | 004 | 005 |
|---|---|---|---|---|---|---|
| V_CTR | DAT_1 | DAT_2 | DAT_3 | DAT_7 | DAT_4 | DAT_5 |

INTEGRATED CIRCUIT AND TEST OPERATION METHOD THEREOF

CROSS-REFERENCES TO RELATED APPLICATION

The present application claims priority under 35 U.S.C. § 119(a) to Korean application NO. 10-2020-0107398 filed on Aug. 25, 2020, in the Korean Intellectual Property Office, which is incorporated herein by reference in its entirety as set forth in full.

BACKGROUND

1. Technical Field

Various embodiments generally relate to an integrated circuit and a test operation method thereof, and, more particularly, to an integrated circuit for providing various test sequence and a test operation method of the integrated circuit.

2. Related Art

In general, various tests are performed on an integrated circuit, such as a semiconductor device and a semiconductor memory device, before it is released to a market. Traditionally, an Automatic Test Equipment (ATE) has been utilized for a test operation on an integrated circuit. The automatic test equipment is a single product that is developed to determine whether an integrated circuit is well-designed. Since the automatic test equipment costs are relatively high, the cost of an integrated circuit is based on whether the integrated circuit is tested by the automatic test equipment. As it takes longer to test an integrated circuit with the automatic test equipment, the integrated circuit costs are higher.

Based on the above described problem, efforts have been made to manufacture a built-in self-test circuit. The built-in self-test circuit is mounted within an integrated circuit and performs a test operation on the integrated circuit instead of the automatic test equipment. The built-in self-test circuit reduces the overall manufacturing time and thus, lowers the cost of the integrated circuit.

However, the built-in self-test circuit has complex configuration, requires a great space, and provides only stereotypical test sequences, in general. The complex configuration causes vulnerabilities to the built-in self-test circuit, namely noise. Noise can cause the built-in self-test circuit to output an erroneous test result value. The requirement of great space means that it is a great burden to mount the built-in self-test circuit within the integrated circuit when designing the built-in self-test circuit. The stereotypical test sequences do not allow for any test operation other than a pre-set operation. Hereinafter, described is an integrated circuit providing only stereotypical test sequences.

FIG. 1 is a block diagram, illustrating a traditional integrated circuit.

Referring to FIG. 1, the integrated circuit includes a test counting circuit 10, a test information storage circuit 20, and a driving circuit 30.

The test counting circuit 10 is configured to generate a counting address signal ADD_C, which is sequentially counted during a test operation. The test information storage circuit 20 is configured to output a test control value V_CTR based on the counting address signal ADD_C. Each test control value V_CTR that is stored in the test information storage circuit 20 corresponds to each counting address signal ADD_C. Since the test information storage circuit 20 is embodied by the read-only memory (ROM), the test control value V_CTR, once stored in the test information storage circuit 20, is not changeable. The driving circuit 30 is configured to perform a pre-set test operation based on the test control value V_CTR.

The test counting circuit 10 sequentially outputs the counting address signal ADD_C. The test information storage circuit sequentially outputs the test control value V_CTR that corresponds to the counting address signal ADD_C. The driving circuit 30 only can perform a test operation based on stereotypical test sequences, which in turn is based on the sequentially output test control value V_CTR.

SUMMARY

In an embodiment, an integrated circuit may include a test counting circuit, a test information storage circuit, a sequence control circuit and a driving circuit. The test counting circuit may generate a counting address signal. The test information storage circuit may store a test control value and output the test control value based on the counting address signal. The sequence control circuit may change an output sequence of the test control value based on a sequence control signal and output a final test control value based on the test control value or a target control value. The driving circuit may perform a pre-set test operation based on the final test control value.

In an embodiment, a test operation method of an integrated circuit may include inputting change information for an output sequence of a final test control value for a test operation; generating, based on the output sequence, the final test control value from a test control value or a target control value; and performing a test on an integrated circuit based on the final test control value.

DETAILED DESCRIPTION

Figure 1:
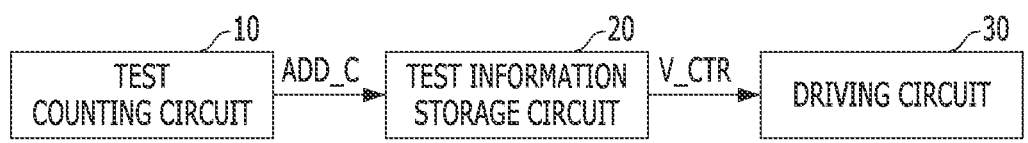
FIG. 1 is a block diagram, illustrating a traditional integrated circuit.

The description of the present disclosure is merely an embodiment for a structural and/or functional description.

The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

According to an embodiment, provided are an integrated circuit capable of providing various test sequences and a test operation method of the integrated circuit.

According to an embodiment, provided are an integrated circuit capable of changing, when there occurs an error in a test control value, the test control value to a target control value and a test operation method of the integrated circuit.

According to an embodiment, various test sequences may be provided during a test operation and thus the degree of freedom may be improved for the test operation.

According to an embodiment, it may be more precisely determined whether an integrated circuit is well-designed based on a test result according to various test sequences.

According to an embodiment, a test control value may be changed to a target control value when there occurs an error in the test control value, which solves a problem in repairing or replacing a circuit storing the error-occurred test control value.

Figure 2:
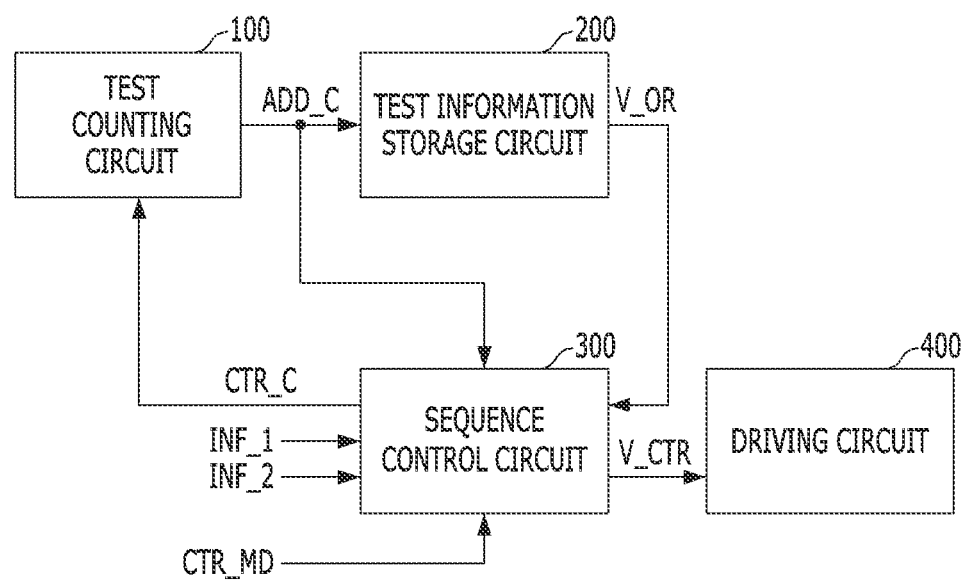
FIG. 2 is a block diagram, illustrating a configuration of an integrated circuit, according to an embodiment.

FIG. 2 is a block diagram, illustrating a configuration of an integrated circuit, according to an embodiment.

Referring to FIG. 2, the integrated circuit may include a test counting circuit 100, a test information storage circuit 200, a sequence control circuit 300, and a driving circuit 400.

The test counting circuit 100 may be configured to generate a counting address signal ADD_C. As described later, a counting operation of the test counting circuit 100 may be controlled based on a counting control signal CTR_C that is generated from the sequence control circuit 300.

The test information storage circuit 200 may be configured to store a test control value V_OR and may be configured to output the test control value V_OR based on the counting address signal ADD_C. The test information storage circuit 200 may be embodied with the read-only memory (ROM). Each test control value V_OR that is stored in the test information storage circuit 200 may correspond to each counting address signal ADD_C. Therefore, the test information storage circuit 200 may output the test control value V_OR, corresponding to the counting address signal ADD_C.

The sequence control circuit 300 may be configured to change an output sequence of the test control value V_OR based on a sequence control signal CTR_MD. Also, the sequence control circuit 300 may be configured to output a final test control value V_CTR based on the test control value V_OR or a target control value. The sequence control signal CTR_MD may correspond to four output sequences, which will be described later.

The driving circuit 400 may be configured to perform a pre-set test operation based on the final test control value V_CTR. The driving circuit 400 may correspond to a semiconductor device and a semiconductor memory device. The driving circuit 400 may be configured to perform a pre-set test operation, such as an initialization operation, based on the final test control value V_CTR.

According to an embodiment, the integrated circuit may change the output sequence based on the sequence control signal CTR_MD. Therefore, the driving circuit 400 may easily perform a desired test operation based on the final test control value V_CTR, corresponding to various output sequences.

The sequence control circuit 300 may control, based on first input information INF_1 and second input information INF_2, a counting operation and an output operation, which will be described later. Therefore, the sequence control circuit 300 may output the final test control value V_CTR, corresponding to various output sequences. According to an embodiment, the integrated circuit may provide four output sequences based on the sequence control signal CTR_MD, as described later. Here, the sequence control signal CTR_MD may be defined as a code-typed signal that selects any of the four output sequences. That is, the sequence control signal CTR_MD may be a code-typed signal with any of the values '00', '01', '10', and '11', respectively, which corresponds to the four output sequences. Therefore, the sequence control circuit 300 may provide an output sequence for the final test control value V_CTR, among the four output sequences, based on the sequence control signal CTR_MD. The four output sequences may include a first output sequence, a second output sequence, a third output sequence, and a fourth output sequence.

Described hereinafter, with reference to FIGS. 3 and 4, will be a configuration and an operation for the first output sequence. Here, the first output sequence may be an output sequence that outputs a target control value as the final test control value V_CTR, instead of the test control value V_OR, based on the counting address signal ADD_C and a target address value, the target address value being input as the first input information INF_1 and the target control value being input as the second input information INF_2.

Figures 3, 4:
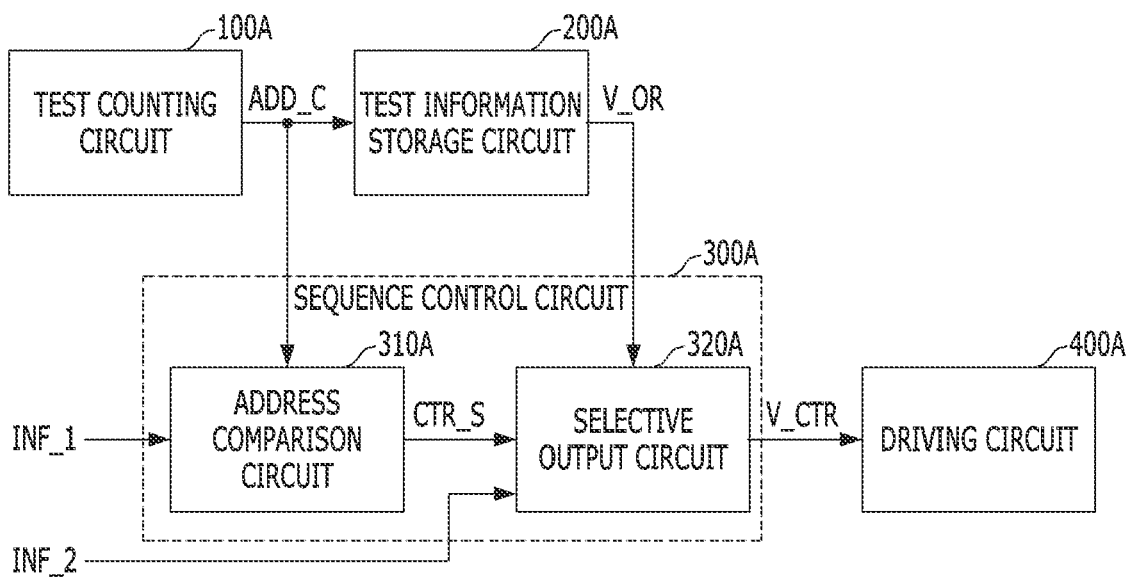
FIG. 3 is a block diagram, illustrating a configuration of an integrated circuit, according to an embodiment.
FIG. 4 is an operation chart, illustrating an operation that is related to a first output sequence of the integrated circuit, illustrated in FIG. 3.

FIG. 3 is a block diagram, illustrating a configuration of an integrated circuit, according to an embodiment.

Referring to FIG. 3, the integrated circuit may include a test counting circuit 100A, a test information storage circuit 200A, a sequence control circuit 300A, and a driving circuit 400A.

The test counting circuit 100A may be configured to generate a counting address signal ADD_C. The counting address signal ADD_C may be an address signal that is sequentially counted.

The test information storage circuit 200A may be configured to store a test control value V_OR and may be configured to output the test control value V_OR based on the counting address signal ADD_C.

The sequence control circuit 300A may receive a target address value as first input information INF_1 and may receive a target control value as second input information INF_2. Based on the counting address signal ADD_C and the target address value, the sequence control circuit 300A may be configured to output the target control value, instead of the test control value V_OR, as a final test control value V_CTR. The sequence control circuit 300A may include an address comparison circuit 310A and a selective output circuit 320A.

The address comparison circuit 310A may be configured to compare the target address value, which is input as the first input information INF_1, to the counting address signal ADD_C to generate a selection control signal CTR_S. Although not illustrated, the address comparison circuit 310A may include a latch circuit that is configured to store the target address value. The address comparison circuit 310A may generate the selection control signal CTR_S with a value of a pre-set logic level when the target address value is the same as the counting address signal ADD_C.

The selective output circuit 320A may be configured to selectively output the target control value, which is input as the second input information INF_2, or the test control value V_OR based on the selection control signal CTR_S. Although not illustrated, the selective output circuit 320A may include a latch circuit that is configured to store the target control value. Based on the selection control signal CTR_S, the selective output circuit 320A may output the target control value as the final test control value V_CTR when the target address value is the same as the counting address signal ADD_C. Also, based on the selection control signal CTR_S, the selective output circuit 320A may output the test control value V_OR as the final test control value V_CTR when the target address value is not the same as the counting address signal ADD_C.

The driving circuit 400A may be configured to perform a pre-set test operation based on the final test control value V_CTR. That is, the driving circuit 400A may be configured to perform a test operation based on the first output sequence for the final test control value V_CTR.

FIG. 4 is an operation chart, illustrating an operation that is related to the first output sequence of the integrated circuit, illustrated in FIG. 3. Hereinafter, for convenience of description, it is assumed that the target address value, which is input as the first input information INF_1, is '003' and the target control value, which is input as the second input information INF_2, is 'DAT_TM'.

Referring to FIGS. 3 and 4, during a test operation, the test counting circuit 100A may generate the counting address signal ADD_C, which is sequentially counted. That is, the test counting circuit 100A may generate the counting address signal ADD_C, which is sequentially counted as '001', '002', '003', '004', and '005'. For convenience of description, FIG. 4 exemplifies 5 values of the counting address signal ADD_C. Then, the test information storage circuit 200A may output the test control value V_OR based on the counting address signal ADD_C. As exemplified in FIG. 4, the test information storage circuit 200A may output the test control value V_OR of 'DAT_1', 'DAT_2', 'DAT_3', 'DAT_4', and 'DAT_5', respectively, based on the counting address signal ADD_C of '001', '002', '003', '004', and '005'.

The sequence control circuit 300A may receive the target address value of '003' as first input information INF_1 and may receive the target control value of 'DAT_TM' as second input information INF_2. The address comparison circuit 310A may be configured to compare the target address value to the counting address signal ADD_C to generate the selection control signal CTR_S. When the counting address signal ADD_C is the same as the target address value of '003', the address comparison circuit 310A may output the selection control signal CTR_S by enabling the selection control signal CTR_S to a pre-set logic level. Therefore, based on the selection control signal CTR_S, the selective output circuit 320A may output the target control value of 'DAT_TM', instead of the test control value V_OR of 'DAT_3', as the final test control value V_CTR, which is input as the second input information INF_2.

That is, the selective output circuit 320A may output, as the final test control value V_CTR, the test control value V_OR of 'DAT_1', 'DAT_2', 'DAT_4' and, 'DAT_5', respectively, when the counting address signal ADD_C are '001', '002', '004', and '005'. Also, when the counting address signal ADD_C is '003', the selective output circuit 320A may output the target control value of 'DAT_TM', instead of the test control value V_OR, as the final test control value V_CTR.

To sum up, the integrated circuit may set the first output sequence for the final test control value V_CTR based on the target address value, which is input as the first input information INF_1, and the target control value, which is input as the second input information INF_2. Here, when the target address value is '003', the target control value of 'DAT_TM' may be output as the final test control value V_CTR based on the first output sequence. Therefore, the driving circuit 400A may perform a test operation for the first output sequence based on the final test control value V_CTR.

As described above, the test information storage circuit 200A, illustrated in FIG. 3, may be embodied with the ROM. Data once stored in the ROM is not changeable. According to an embodiment, when there is an error in the test control value V_OR that is stored in the test information storage circuit 200A, the error-occurred test control value V_OR may be changed to the target control value through the first output sequence. Therefore, even when there is an error in the test control value V_OR that is stored in the test information storage circuit 200A, a test operation may be normally performed without repair or replacement of the test information storage circuit 200A.

Described hereinafter with reference to FIGS. 5 and 6 will be a configuration and an operation for the second output sequence. Here, the second output sequence may be an output sequence that outputs the target control value, the target control value being input as the second input information INF_2, by controlling a counting operation based on the counting address signal ADD_C and the target address value, the target address value being input as the first input information INF_1, and by inserting the target control value into the final test control value V_CTR.

Figures 5, 6:
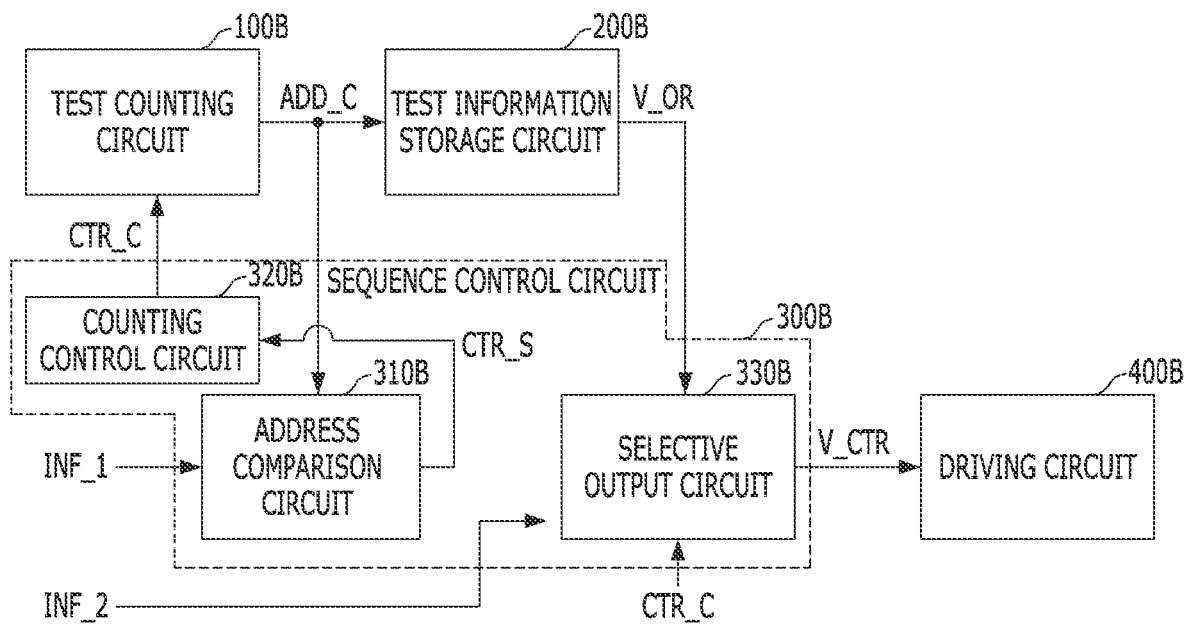
FIG. 5 is a block diagram, illustrating a configuration of an integrated circuit, according to an embodiment.
FIG. 6 is an operation chart, illustrating an operation that is related to a second output sequence of the integrated circuit, illustrated in FIG. 5.

FIG. 5 is a block diagram, illustrating a configuration of an integrated circuit, according to an embodiment.

Referring to FIG. 5, the integrated circuit may include a test counting circuit 100B, a test information storage circuit 200B, a sequence control circuit 300B, and a driving circuit 400B.

The test counting circuit 100B may be configured to generate a counting address signal ADD_C. A deactivation operation and an activation operation for a counting operation of the test counting circuit 100B may be controlled based on the counting control signal CTR_C, which will be described later.

The test information storage circuit 200B may be configured to store a test control value V_OR and may be configured to output the test control value V_OR based on the counting address signal ADD_C.

The sequence control circuit 300B may receive a target address value as first input information INF_1 and may receive a target control value as second input information INF_2. Based on the counting address signal ADD_C and the target address value, the sequence control circuit 300B may be configured to control the deactivation operation and the activation operation of the counting operation of the test counting circuit 100B. Also, the sequence control circuit 300B may be configured to insert the target control value into the final test control value V_CTR to output the target control value. The sequence control circuit 300B may include an address comparison circuit 310B, a counting control circuit 320B, and a selective output circuit 330B.

The address comparison circuit 310B may be configured to compare the target address value, which is input as the first input information INF_1, to the counting address signal ADD_C to generate a selection control signal CTR_S. The address comparison circuit 310B may generate the selection control signal CTR_S with a value of a pre-set logic level when the target address value is the same as the counting address signal ADD_C.

The counting control circuit 320B may be configured to control the counting operation of the test counting circuit 100B based on the selection control signal CTR_S. The counting control circuit 320B may generate the counting control signal CTR_C based on the selection control signal CTR_S. The activation operation or the deactivation operation of the counting operation of the test counting circuit 100B may be controlled based on the counting control signal CTR_C. As described later with reference to FIG. 6, the counting control circuit 320B may deactivate the counting operation of the test counting circuit 100B based on the selection control signal CTR_S. Also, the counting control circuit 320B may activate the counting operation of the test counting circuit 100B after the target control value is output as the final test control value V_CTR.

The selective output circuit 330B may be configured to selectively output the target control value, which is input as the second input information INF_2, or the test control value V_OR based on the counting control signal CTR_C. Based on the counting control signal CTR_C, the selective output circuit 330B may insert the target control value into the final test control value V_CTR to output the target control value when the target address value is the same as the counting address signal ADD_C.

The driving circuit 400B may be configured to perform a pre-set test operation based on the final test control value V_CTR. That is, the driving circuit 400B may be configured to perform a test operation based on the second output sequence for the final test control value V_CTR.

FIG. 6 is an operation chart, illustrating an operation that is related to the second output sequence of the integrated circuit, illustrated in FIG. 5. Hereinafter, for convenience of description, it is assumed that the target address value, which is input as the first input information INF_1, is '003' and the target control value, which is input as the second input information INF_2, is 'DAT_TM'.

Referring to FIGS. 5 and 6, during a test operation, the test counting circuit 100B may generate the counting address signal ADD_C, which is sequentially counted. Then, the test information storage circuit 200B may output the test control value V_OR based on the counting address signal ADD_C.

The sequence control circuit 300B may receive the target address value of '003' as first input information INF_1 and may receive the target control value of 'DAT_TM' as second input information INF_2. The address comparison circuit 310B may be configured to compare the target address value to the counting address signal ADD_C to generate the selection control signal CTR_S. When the counting address signal ADD_C is the same as the target address value of '003', the address comparison circuit 310B may output the selection control signal CTR_S by enabling the selection control signal CTR_S to a pre-set logic level. Then, the counting control circuit 320B may generate the counting control signal CTR_C to deactivate the counting operation of the test counting circuit 100B based on the selection control signal CTR_S. Therefore, the test counting circuit 100B may output the counting address signal ADD_C of '003', which is the same value as the previous counting address signal ADD_C. Also, based on the counting control signal CTR_C, the selective output circuit 330B may output the target control value of 'DAT_TM', which is input as the second input information INF_2, instead of the test control value V_OR of 'DAT_3', by inserting the target control value of 'DAT_TM' into the final test control value V_CTR.

That is, the selective output circuit 330B may output, as the final test control value V_CTR, the test control value V_OR of 'DAT_1', 'DAT_2', 'DAT_3', 'DAT_4', and 'DAT_5', respectively, when the counting address signal ADD_C are '001', '002', '003', '004', and '005'. Also, the counting control circuit 320B may deactivate the counting operation of the test counting circuit 100B when the counting address signal ADD_C is '003'. Accordingly, the test counting circuit 100B may keep the previous counting address signal ADD_C of '003'. Also, the selective output circuit 330B may output the target control value of 'DAT_TM' that corresponds to the previous counting address signal ADD_C of '003' by inserting the target control value of 'DAT_TM' into the final test control value V_CTR. After the target control value of 'DAT_TM' is output, the counting control circuit 320B may generate the counting control signal CTR_C to activate the counting operation of the test counting circuit 100B.

To sum up, the integrated circuit may set the second output sequence for the final test control value V_CTR based on the target address value, which is input as the first input information INF_1, and the target control value, which is input as the second input information INF_2. Here, when the target address value is '003', the target control value of 'DAT_TM' may be inserted into the final test control value V_CTR, and the final test control value V_CTR may be output based on the second output sequence. Therefore, the driving circuit 400B may perform a test operation for the second output sequence based on the final test control value V_CTR.

Described hereinafter with reference to FIGS. 7 to 9 will be a configuration and an operation for the third output sequence and the fourth output sequence. According to an embodiment, an integrated circuit may change a counting address signal ADD_C, which is output from a test counting circuit 100C, to a change address value, which is input as the second input information INF_2, and may output the final test control value V_CTR based on the target address value, which is input as the first input information INF_1, and based on the counting address signal ADD_C. Here, the third output sequence and the fourth output sequence may be output sequences that output the final test control value V_CTR based on the counting address signal ADD_C, into which the change address value is reflected.

Figures 7, 8:
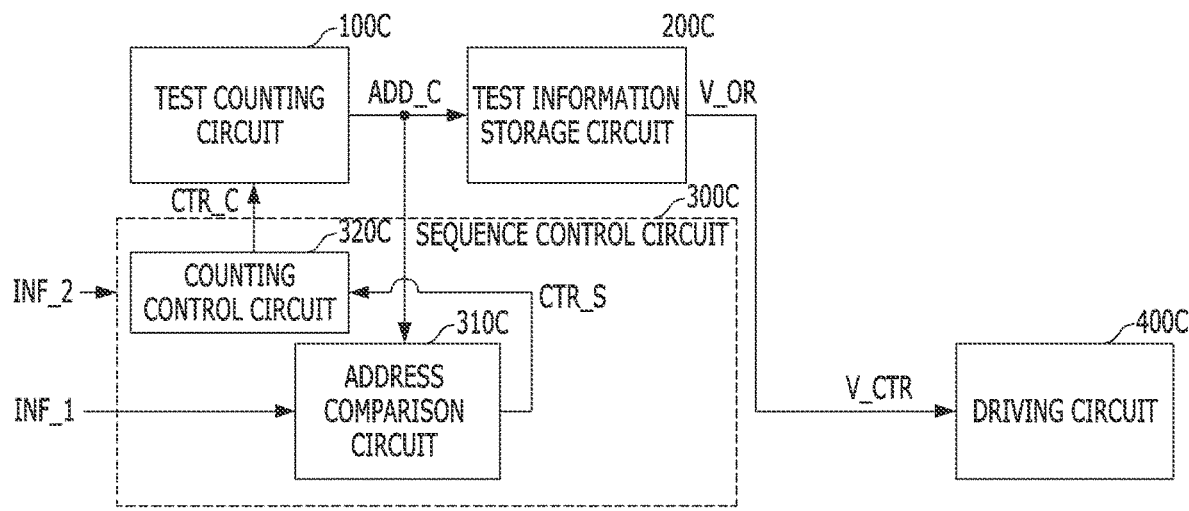
FIG. 7 is a block diagram, illustrating a configuration of an integrated circuit, according to an embodiment.
FIG. 8 is an operation chart, illustrating an operation that is related to a third output sequence of the integrated circuit, illustrated in FIG. 7.

FIG. 7 is a block diagram, illustrating a configuration of an integrated circuit, according to an embodiment.

Referring to FIG. 7, the integrated circuit may include a test counting circuit 100C, a test information storage circuit 200C, a sequence control circuit 300C and a driving circuit 400C.

The test counting circuit 100C may be configured to generate a counting address signal ADD_C. A counting operation of the test counting circuit 100C may be controlled based on the counting control signal CTR_C, which will be described later.

The test information storage circuit 200C may be configured to store a test control value V_OR and may be configured to output the test control value V_OR based on the counting address signal ADD_C. Here, the test control value V_OR may correspond to a final test control value V_CTR that is provided from the driving circuit 400C.

The sequence control circuit 300C may receive a target address value as first input information INF_1 and may receive a change address value as second input information INF_2. The sequence control circuit 300C may be configured to control the counting operation of the test counting circuit 100C based on the counting address signal ADD_C and the target address value. That is, the sequence control circuit 300C may be configured to change the counting address signal ADD_C, which is output from the test counting circuit 100C, to the change address value. The sequence control circuit 300C may include an address comparison circuit 310C and a counting control circuit 320C.

The address comparison circuit 310C may be configured to compare the target address value, which is input as the first input information INF_1, to the counting address signal ADD_C to generate a selection control signal CTR_S. When the target address value is the same as the counting address signal ADD_C, the address comparison circuit 310C may generate the selection control signal CTR_S with a value of a pre-set logic level.

The counting control circuit 320C may be configured to reflect the change address value, which is input as the second input information INF_2, into the counting operation of the test counting circuit 100C based on the selection control signal CTR_S. The counting control circuit 320C may generate the counting control signal CTR_C that corresponds to the change address value based on the selection control signal CTR_S. The test counting circuit 100C may generate the counting address signal ADD_C, into which the change address value is reflected, based on the counting control signal CTR_C. The test information storage circuit 200C may output the test control value V_OR (i.e., the final test control value V_CTR) based on the counting address signal ADD_C.

The driving circuit 400C may be configured to perform a pre-set test operation based on the final test control value V_CTR. That is, the driving circuit 400C may be configured to perform a test operation based on the third output sequence and the fourth output sequence for the final test control value V_CTR.

FIG. 8 is an operation chart, illustrating an operation that is related to the third output sequence of the integrated circuit, illustrated in FIG. 7. Hereinafter, for convenience of description, it is assumed that the target address value, which is input as the first input information INF_1, is '003' and the change address value, which is input as the second input information INF_2, is '007'.

Referring to FIGS. 7 and 8, during a test operation, the test counting circuit 100C may generate the counting address signal ADD_C, which is sequentially counted. Then, the test information storage circuit 200B may output the test control value V_OR as the final test control value V_CTR based on the counting address signal ADD_C.

The sequence control circuit 300C may receive the target address value of '003' as first input information INF_1 and may receive the change address value of '007' as second input information INF_2. The address comparison circuit 310C may be configured to compare the target address value to the counting address signal ADD_C to generate the selection control signal CTR_S. When the counting address signal ADD_C is the same as the target address value of '003', the address comparison circuit 310C may output the selection control signal CTR_S by enabling the selection control signal CTR_S to a pre-set logic level. Then, the counting control circuit 320C may generate, based on the selection control signal CTR_S, the counting control signal CTR_C for the test counting circuit 100C to count the change address value to the value of '007'. Therefore, the test counting circuit 100C may output the change address value of '007' based on the counting control signal CTR_C. Also, the test information storage circuit 200C may output, as the final test control value V_CTR, the test control value V_OR of 'DAT_7' that corresponds to the counting address signal ADD_C of '007'.

That is, the test information storage circuit 200C may output, as the final test control value V_CTR, the test control value V_OR of 'DAT_1', 'DAT_2', and 'DAT_3', respectively, when the counting address signal ADD_C are '001', '002', and '003'. Also, when the counting address signal ADD_C output from the test counting circuit 100C is '003', the counting control circuit 320C may change the counting address signal ADD_C to '007' of the change address value to output '007' of the change address value. Accordingly, the test information storage circuit 200C may output, as the final test control value V_CTR, the test control value V_OR of 'DAT_7' that corresponds to the counting address signal ADD_C of '007'. After outputting '007' of the change address value, the test counting circuit 100C may output '008' of the counting address signal ADD_C, which is subsequent to the change address value of '007'. Therefore, the test information storage circuit 200C may output, as the final test control value V_CTR, the test control value V_OR of 'DAT_8' that corresponds to the counting address signal ADD_C of '008'.

To sum up, the integrated circuit may set the third output sequence for the final test control value V_CTR based on the change address value, which is input as the second input information INF_2, based on the target address value, which is input as the first input information INF_1. Here, the final test control value V_CTR of 'DAT_7' that corresponds to the change address value of '007' may be output based on the third output sequence. Then, the final test control value V_CTR of 'DAT_8' that corresponds to the counting address signal ADD_C of '008', which is subsequent to the change address value of '007', may be output. Therefore, the driving circuit 400C may perform a test operation for the third output sequence based on the final test control value V_CTR.

Figures 9, 10:
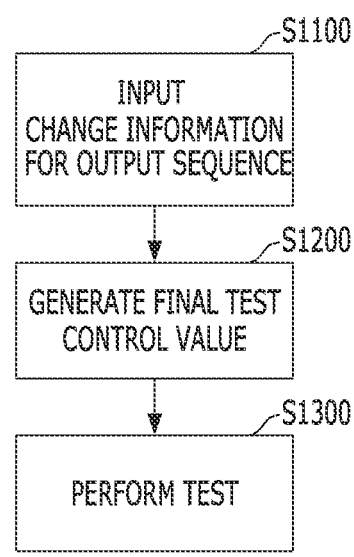
FIG. 9 is an operation chart, illustrating an operation that is related to a fourth output sequence of the integrated circuit, illustrated in FIG. 7.
FIG. 10 is a flowchart, illustrating a test operation method of the integrated circuit, illustrated in FIG. 2.

FIG. 9 is an operation chart, illustrating an operation that is related to the fourth output sequence of the integrated circuit, illustrated in FIG. 7. Hereinafter, for convenience of description, it is assumed that the target address value, which is input as the first input information INF_1, is '003' and the change address value, which is input as the second input information INF_2, is '007'.

Similar to the embodiment of FIG. 8, the final test control value V_CTR of 'DAT_7' that corresponds to the counting address signal ADD_C of '007' may be output according to the embodiment of FIG. 9. After outputting the change address value of '007', the test counting circuit 100C may output the originally established counting address signal ADD_C of '004'. Accordingly, the test information storage circuit 200C may output, as the final test control value V_CTR, the test control value V_OR of 'DAT_4' that corresponds to the counting address signal ADD_C of '004'.

To sum up, the integrated circuit may set the fourth output sequence for the final test control value V_CTR based on the change address value, which is input as the second input information INF_2 based on the target address value, which is input as the first input information INF_1. Here, the final test control value V_CTR of 'DAT_7' that corresponds to the change address value of '007' may be output based on the fourth output sequence. Then, the final test control value V_CTR of 'DAT_4' that corresponds to the originally established counting address signal ADD_C of '004', which is subsequent to the change address value of '007', may be output. Therefore, the driving circuit 400C may perform a test operation for the fourth output sequence based on the final test control value V_CTR.

FIG. 10 is a flowchart, illustrating a test operation method of the integrated circuit, illustrated in FIG. 2.

Referring to FIGS. 2 and 10, the test operation method of the integrated circuit may include steps of inputting change information for an output sequence (S1100), generating a final test control value (S1200), and performing a test operation (S1300).

The step of inputting the change information for the output sequence (S1100) may be a step of inputting the change information for the output sequence of the final test control value V_CTR for a test operation. Here, the change information may refer to the first input information INF_1 and the second input information INF_2. As described with reference to FIGS. 3 to 9, the integrated circuit may include the first to fourth output sequences. The change information for the respective first to fourth output sequences may be different from one another.

The step of generating a final test control value (S1200) may be a step of generating the final test control value V_CTR based on the output sequence, which is set based on the sequence control signal CTR_MD, illustrated in FIG. 2. As described with reference to FIGS. 4, 6, 8, and 9, the integrated circuit may set the final test control value V_CTR in different ways based on the first to fourth output sequences.

As described with reference to FIG. 4, the integrated circuit may output the target control value ('DAT_TM'), instead of the test control value V_OR, as the final test control value V_CTR based on the counting address signal ADD_C and the target address value. That is, the final test control value V_CTR that corresponds to the first output sequence may be output. As described with reference to FIG. 6, the integrated circuit may control the activation operation and the deactivation operation of the counting operation based on the counting address signal ADD_C and the target address value and may output the target control value ('DAT_TM') by inserting the target control value ('DAT_TM') into the final test control value V_CTR. That is, the final test control value V_CTR that corresponds to the second output sequence may be output. As described with reference to FIG. 8, the integrated circuit may change the counting address signal ADD_C to the change address value and may output the final test control value V_CTR and then output the final test control value V_CTR that corresponds to the counting address signal ADD_C subsequent to the change address value. That is, the final test control value V_CTR that corresponds to the third output sequence may be output. As described with reference to FIG. 9, the integrated circuit may change the counting address signal ADD_C to the change address value and may output the final test control value V_CTR and then output the final test control value V_CTR that corresponds to the originally established counting address signal ADD_C. That is, the final test control value V_CTR that corresponds to the fourth output sequence may be output.

To sum up, the integrated circuit may generate the final test control value V_CTR that corresponds to the first to fourth output sequence. Therefore, various test sequences may be provided during a test operation and thus, the increased degree of freedom may be provided for the test operation. Further, it may be more precisely determined whether an integrated circuit is well-designed based on a test result based on various test sequences.

While certain embodiments have been described above, it will be understood to those skilled in the art that the embodiments described are by way of example only. Accordingly, the integrated circuit and test operation method thereof should not be limited based on the described embodiments. Rather, the integrated circuit and test operation method thereof described herein should only be limited in light of the claims that follow when taken in conjunction with the above description and accompanying drawings.

What is claimed is:

1. An integrated circuit comprising:
    a test counting circuit configured to generate a counting address signal;
    a test information storage circuit configured to store a test control value corresponding to a pre-set test operation and output the test control value based on the counting address signal;
    a sequence control circuit configured to change an output sequence of the test control value based on a sequence control signal and configured to output a final test control value based on the test control value or a target control value; and
    a driving circuit configured to perform the pre-set test operation based on the final test control value.

2. The integrated circuit of claim 1, wherein when the output sequence is a first output sequence based on the sequence control signal, the sequence control circuit is configured to output the target control value, instead of the test control value, as the final test control value based on the counting address signal and a target address value.

3. The integrated circuit of claim 2, wherein the sequence control circuit includes:
    an address comparison circuit configured to compare the target address value to the counting address signal to generate a selection control signal; and a selective output circuit configured to selectively output the target control value or the test control value based on the selection control signal.

4. The integrated circuit of claim 1, wherein, when the output sequence is a second output sequence based on the sequence control signal, the sequence control circuit is configured to control a counting operation of the test counting circuit based on the counting address signal and a target address value and configured to insert the target control value into the final test control value to output the target control value.

5. The integrated circuit of claim 4, wherein the sequence control circuit includes:
   an address comparison circuit configured to compare the target address value to the counting address signal to generate a selection control signal;
   a counting control circuit configured to control the counting operation of the test counting circuit based on the selection control signal; and
   a selective output circuit configured to selectively output the target control value or the test control value based on a counting control signal that is generated from the counting control circuit.

6. The integrated circuit of claim 5, wherein the counting control circuit is configured to deactivate the counting operation of the test counting circuit based on the selection control signal and configured to activate the counting operation of the test counting circuit after the target control value is output.

7. The integrated circuit of claim 5, wherein the test counting circuit is configured to keep a previous counting address signal based on a counting control operation of the counting control circuit and
   wherein the selective output circuit is configured to output the target control value that corresponds to the previous counting address signal.

8. The integrated circuit of claim 1, wherein, when the output sequence is one of a third output sequence and a fourth output sequence based on the sequence control signal, the sequence control circuit is configured to change the counting address signal, which is output from the test counting circuit, to a change address value based on the counting address signal and a target address value.

9. The integrated circuit of claim 8, wherein the sequence control circuit includes:
   an address comparison circuit configured to compare the target address value to the counting address signal to generate a selection control signal; and
   a counting control circuit configured to reflect the change address value into a counting operation of the test counting circuit based on the selection control signal.

10. The integrated circuit of claim 9, wherein the test counting circuit is configured to output the change address value based on a counting control signal, which is generated from the counting control circuit.

11. The integrated circuit of claim 10, wherein, when the output sequence is the third output sequence, after outputting the change address value, the test counting circuit is configured to generate the counting address signal, which is subsequent to the change address value.

12. The integrated circuit of claim 10, wherein when the output sequence is the fourth output sequence, after outputting the change address value, the test counting circuit is configured to generate the counting address signal, which is originally established.

13. A test operation method of an integrated circuit, the test operation method comprising:
   inputting change information for an output sequence of a final test control value for a test operation;
   generating, based on the output sequence, the final test control value from a test control value or a target control value corresponding to a pre-set test operation; and
   performing a test on an integrated circuit based on the final test control value.

14. The test operation method of claim 13, further comprising before or after the inputting:
   generating a counting address signal through a counting operation; and
   outputting the test control value based on the counting address signal.

15. The test operation method of claim 14, wherein the generating of the final test control value includes outputting the target control value, instead of the test control value, as the final test control value based on the counting address signal and a target address value.

16. The test operation method of claim 14, wherein the generating of the final test control value includes controlling an activation operation and a deactivation operation of the counting operation based on the counting address signal and a target address value, and inserting the target control value into the final test control value to output the target control value.

17. The test operation method of claim 14, wherein the generating of the final test control value includes changing the counting address signal to a change address value, outputting the final test control value, and then outputting the final test control value that corresponds to the counting address signal, which is subsequent to the change address value.

18. The test operation method of claim 14, wherein the generating of the final test control value includes changing the counting address signal to a change address value, outputting the final test control value, and then outputting the final test control value that corresponds to the counting address signal, which is originally established.

* * * * *